United States Patent
Park et al.

(10) Patent No.: US 8,735,941 B2
(45) Date of Patent: May 27, 2014

(54) NITRIDE BASED SEMICONDUCTOR DEVICE AND METHOD FOR MANUFACTURING THE SAME

(75) Inventors: Kiyeol Park, Gyeonggi-do (KR);
Woochul Jeon, Gyeonggi-do (KR);
Younghwan Park, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/049,594

(22) Filed: Mar. 16, 2011

(65) Prior Publication Data

US 2012/0146095 A1    Jun. 14, 2012

(30) Foreign Application Priority Data

Dec. 9, 2010    (KR) ........................ 10-2010-0125289

(51) Int. Cl.
*H01L 29/66*    (2006.01)
*H01L 27/148*    (2006.01)

(52) U.S. Cl.
USPC ............... 257/194; 257/22; 257/77; 257/231; 257/624; 257/E21.108

(58) Field of Classification Search
CPC ............ H01L 29/2003; H01L 29/7787; H01L 29/778; H01L 29/872; H01L 29/40; H01L 29/812; H01L 21/28; H01L 21/329; H01L 21/335
USPC ............. 257/183, 194, 231, 22, 77, 192, 624, 257/E21.108, E29.246
See application file for complete search history.

(56) References Cited

U.S. PATENT DOCUMENTS

| | | | |
|---|---|---|---|
| 7,291,872 B2 * | 11/2007 | Hikita et al. | 257/192 |
| 7,777,305 B2 | 8/2010 | Kuroda et al. | |
| 7,936,049 B2 * | 5/2011 | Kuroda et al. | 257/624 |
| 2004/0201038 A1 | 10/2004 | Kimura et al. | |
| 2006/0289894 A1 * | 12/2006 | Murata et al. | 257/192 |
| 2008/0179694 A1 * | 7/2008 | Nakazawa et al. | 257/402 |
| 2008/0217625 A1 * | 9/2008 | Kuroda et al. | 257/76 |
| 2010/0019279 A1 | 1/2010 | Chen et al. | |
| 2011/0057231 A1 * | 3/2011 | Jeon et al. | 257/183 |
| 2011/0233612 A1 * | 9/2011 | Park et al. | 257/194 |
| 2011/0254057 A1 * | 10/2011 | Jeon et al. | 257/201 |

FOREIGN PATENT DOCUMENTS

| | | |
|---|---|---|
| KR | 2004-0018502 | 3/2004 |
| KR | 10-2006-0126712 A | 12/2006 |

OTHER PUBLICATIONS

Korean Office Action issued in Korean Patent Application No. 10-2010-0125289 dated Apr. 27, 2012.
Chinese Office Action with English translation issued in Chinese Application No. 201110319165.1 issued on Dec. 25, 2013.

* cited by examiner

*Primary Examiner* — George Fourson, III
*Assistant Examiner* — Wilner Jean Baptiste
(74) *Attorney, Agent, or Firm* — McDermott Will & Emery LLP (57) ABSTRACT

Disclosed herein is a nitride based semiconductor device including: a base substrate; an epitaxial growth layer disposed on the base substrate and generating a 2-dimensional electron gas in an inner portion thereof; and an electrode structure disposed on the epitaxial growth layer, wherein the electrode structure includes: a gate electrode; a source electrode disposed at one side of the gate electrode; and a drain electrode disposed at the other side of the gate electrode and having an extension part extended to the inner portion of the epitaxial growth layer to contact the 2-dimensional electron gas.

5 Claims, 5 Drawing Sheets

NITRIDE BASED SEMICONDUCTOR DEVICE AND METHOD FOR MANUFACTURING THE SAME

CROSS REFERENCE(S) TO RELATED APPLICATIONS

This application claims the benefit under 35 U.S.C. Section 119 of Korean Patent Application Serial No. 10-2010-0125289, entitled "Nitride Based Semiconductor Device And Method For Manufacturing The Same" filed on Dec. 9, 2010, which is hereby incorporated by reference in its entirety into this application.

BACKGROUND OF THE INVENTION

1. Technical Field

The present invention relates to a nitride based semiconductor device and a method for manufacturing the same, and more particularly, to a nitride based semiconductor device capable of having increased withstand voltage and being operated at low turn-on voltage to improve switching operating efficiency, and a method for manufacturing the same.

2. Description of the Related Art

Among semiconductor devices, there is a high electron mobility transistor (HEMT) using a two-dimensional electron gas (2DEG) as a current movement channel. A general high electron mobility transistor includes a base substrate such as a sapphire substrate, a nitride based epitaxial growth layer formed on the base substrate, and an electrode structure formed on the epitaxial growth layer. The electrode structure includes a gate electrode, a source electrode disposed at one side of the gate electrode, and a drain electrode disposed at the other side of the gate electrode. Generally, the gate electrode is a Schottky electrode forming a Schottky contact with the epitaxial growth layer, and the source and drain electrodes are ohmic electrodes forming an ohmic contact with the epitaxial growth layer.

In the nitride based semiconductor device having a structure as described above, current density and withstand voltage of the device should be increased in order to improve characteristics as a transistor and expand applications. However, there is a trade-off relation between the current density and the withstand voltage, such that when the current density is increased, the withstand voltage is decreased. For example, the current density is determined by ohmic contact resistance between the drain electrode and the source electrode and resistance of a channel, the withstand voltage is determined by withstand voltage between the Schottky electrode, which is the gate electrode, and the ohmic electrode, which is the drain electrode. Therefore, generally, the withstand voltage with respect to the ohmic electrode, which is the drain electrode, should be increased in order to increase the withstand voltage; however, in this case, a problem such as reduction in the current density, or the like, may be caused.

SUMMARY OF THE INVENTION

An object of the present invention is to provide a nitride based semiconductor device capable of having increased withstand voltage and being operated at low turn-on voltage to improve switching operating efficiency.

Another object of the present invention is to provide a nitride based semiconductor device capable of having increased withstand voltage, while preventing decrease of current density.

Another object of the present invention is to provide a method for manufacturing a nitride based semiconductor device capable of having increased withstand voltage and being operated at low turn-on voltage to improve switching operating efficiency.

Another object of the present invention is to provide a method for manufacturing a nitride based semiconductor device capable of having increased withstand voltage, while preventing decrease of current density.

According to an exemplary embodiment of the present invention, there is provided a nitride based semiconductor device including: a base substrate; an epitaxial growth layer disposed on the base substrate and generating a two-dimensional electron gas in an inner portion thereof; and an electrode structure disposed on the epitaxial growth layer, wherein the electrode structure includes: a gate electrode; a source electrode disposed at one side of the gate electrode; and a drain electrode disposed at the other side of the gate electrode and having an extension part extended to the inner portion of the epitaxial growth layer to contact the two-dimensional electron gas.

The drain electrode may be a Schottky electrode forming a Schottky contact with the epitaxial growth layer.

The gate electrode may include a Schottky electrode forming a Schottky contact with the epitaxial growth layer, and the source electrode may include an ohmic electrode forming an ohmic contact with the epitaxial growth layer.

The extension part may have an island shaped cross section.

The extension part may be formed to have a lattice pattern.

The extension part may have a ring shaped cross section.

The base substrate may include at least any one of a silicon substrate, a silicon carbide substrate, and a sapphire substrate.

The epitaxial growth layer may include: a lower nitride layer grown using the base substrate as a seed layer; and an upper nitride layer grown using the lower nitride layer as a seed layer and having a wider energy band gap than that of the lower nitride layer.

According to another exemplary embodiment of the present invention, there is provided a method for manufacturing a nitride based semiconductor device, including: preparing a base substrate; forming an epitaxial growth layer on the base substrate, the epitaxial growth layer generating a two-dimensional electron gas in an inner portion thereof; and forming an electrode structure on the epitaxial growth layer, wherein the forming of the electrode structure includes: forming a gate electrode; forming a source electrode at one side of the gate electrode; and forming a drain electrode at the other side of the gate electrode, the drain electrode having an extension part extended to the inner portion of the epitaxial growth layer to contact the two-dimensional electron gas.

The forming of the drain electrode may include: forming a depression part exposing the two-dimensional electron gas in a drain electrode forming region of the epitaxial growth layer; and forming a metal layer filled in the depression part to form a Schottky electrode forming a Schottky contact with the epitaxial growth layer.

The forming of the depression part may be made by performing a mesa process for separation between the nitride based semiconductor devices.

The preparing of the base substrate may include preparing at least any one of a silicon substrate, a silicon carbide substrate, and a sapphire substrate.

The forming of the epitaxial growth layer may include: growing a lower nitride layer by performing an epitaxial growth process on the base substrate using the base substrate as a seed layer; and growing an upper nitride layer on the lower nitride layer using the lower nitride layer as a seed layer, the upper nitride layer having a wider energy band gap than that of the lower nitride layer.

DESCRIPTION OF THE PREFERRED EMBODIMENTS

Various advantages and features of the present invention and methods accomplishing thereof will become apparent from the following description of embodiments with reference to the accompanying drawings. However, the present invention may be modified in many different forms and it should not be limited to the embodiments set forth herein. Rather, these embodiments may be provided so that this disclosure will be thorough and complete, and will fully convey the scope of the invention to those skilled in the art. Like reference numerals throughout the specification denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Further, the exemplary embodiments described in the specification will be described with reference to cross-sectional views and/or plan views that are ideal exemplification figures. In drawings, the thickness of layers and regions is exaggerated for efficient description of technical contents. Therefore, exemplified forms may be changed by manufacturing technologies and/or tolerance. Therefore, the exemplary embodiments of the present invention are not limited to specific forms but may include the change in forms generated according to the manufacturing processes. For example, an etching region vertically shown may be rounded or may have a predetermined curvature. Therefore, the regions shown in the drawings have schematic attributes and the shapes shown in the drawings show specific shapes of device regions by way of example only but are not limited to the scope of the present.

Hereinafter, a nitride based semiconductor device and a method for manufacturing the same according to exemplary embodiments of the present invention will be described in detail with reference to the accompanying drawings.

Figure 1:
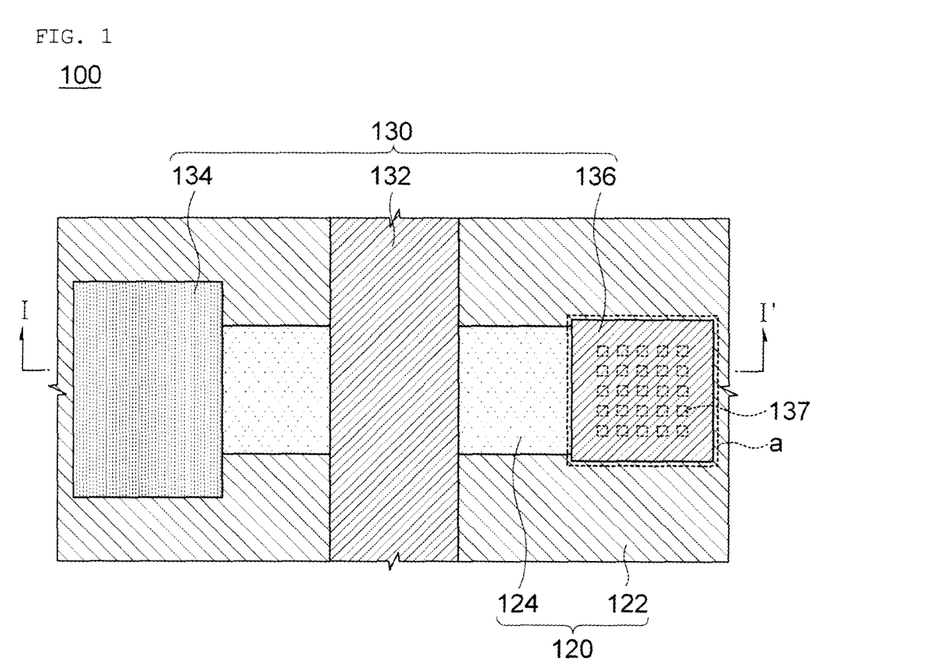
FIG. 1 is a plan view showing a nitride based semiconductor device according to an exemplary embodiment of the present invention.
Figure 2:
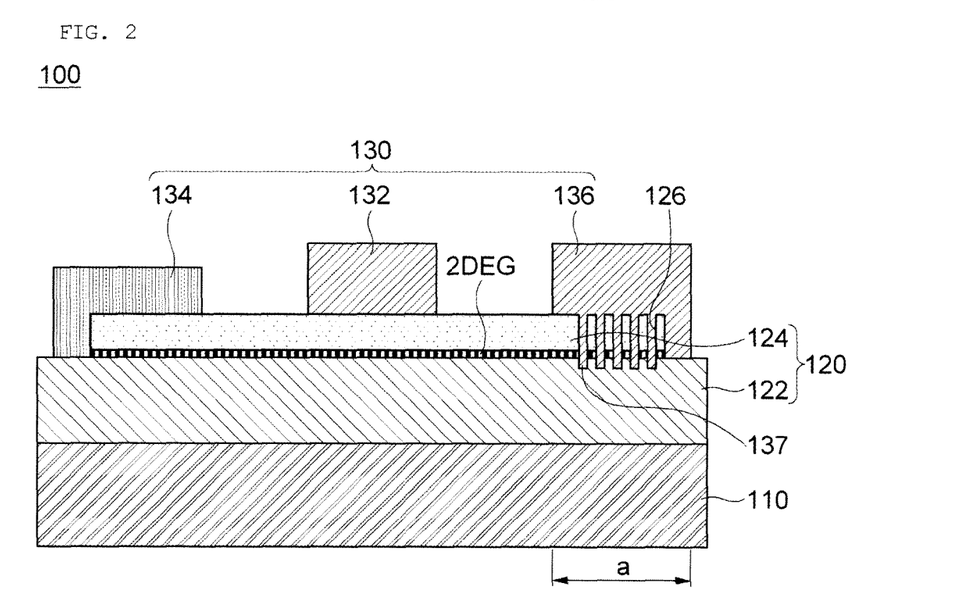
FIG. 2 is a cross-sectional view taken along line I-I' of FIG. 1.

FIG. 1 is a plan view showing a nitride based semiconductor device according to an exemplary embodiment of the present invention, and FIG. 2 is a cross-sectional view taken along line I-I' of FIG. 1.

Referring to FIGS. 1 and 2, a nitride based semiconductor device 100 according to an embodiment of the present invention may be configured to include a base substrate 110, an epitaxial growth layer 120, and an electrode structure 130.

The base substrate 110 may be a base for forming the epitaxial growth layer 120 and the electrode structure 130. As the base substrate 110, various kinds of substrates may be used. For example, the base substrate 110 may be any one of a silicon substrate, a silicon carbide substrate, and a sapphire substrate.

The epitaxial growth layer 120 may include a lower nitride layer 122 and an upper nitride layer 124 that are sequentially stacked on the base substrate 110. The upper nitride layer 124 may be made of a material having a wider energy band gap than that of the lower nitride layer 122. The upper nitride layer 124 may be made of a material having a different lattice constant from that of the lower nitride layer 122. For example, the lower nitride layer 122 and the upper nitride layer 124 may be layers including III-nitride based materials. More specifically, the lower nitride layer 122 may be made of any one of gallium nitride (GaN), aluminum gallium nitride (AlGaN), indium gallium nitride (InGaN), and indium aluminum gallium nitride (InAlGaN), and the upper nitride layer 124 may be made of the other one of gallium nitride (GaN), aluminum gallium nitride (AlGaN), indium gallium nitride (InGaN), and indium aluminum gallium nitride (InAlGaN). As an example, the lower nitride layer 122 may be a gallium nitride (GaN) layer, and the upper nitride layer 124 may be an aluminum gallium nitride (AlGaN) layer.

In an inner portion of the epitaxial growth layer 120 having the structure as described above, a two-dimensional electron gas (2DEG) may be generated at an interface between the lower nitride layer 122 and the upper nitride layer 124. Current may flow through the 2-dimensional electron gas (2DEG) during switching operation of the nitride based semiconductor device 100.

In this configuration, a buffer layer (not shown) may be interposed between the base substrate 110 and the epitaxial growth layer 120. The buffer layer may be a layer for reducing defect generation due to lattice mismatch between the base substrate 110 and the epitaxial growth layer 120. For this, the buffer layer may have a super-lattice layer structure in which thin films made of different materials are alternately stacked. The super-lattice layer may have a multi-layer structure in which an insulator layer and a semiconductor layer are alternately grown.

The electrode structure 130 may be a transistor electrode structure disposed on the epitaxial growth layer 120. For example, the electrode structure 130 may have a high electrode mobility transistor (HEMT) structure using a 2-dimensional electron gas (2DEG) as a current flow channel. As an example, the electrode structure 130 may include a gate electrode 132, a source electrode 134, and a drain electrode 136. The gate electrode 132 may be disposed between the source electrode 134 and the drain electrode 136. The gate electrode 132 may be a Schottky electrode forming a Schottky contact with the epitaxial growth layer 120. The source electrode 134 may be disposed at one side of the gate electrode 132, and may be an ohmic electrode forming an ohmic contact with the epitaxial growth layer 120. The drain electrode 136 may be disposed at the other side of the gate electrode 132, and may be a Schottky electrode forming a Schottky contact with the epitaxial growth layer 120.

Meanwhile, the electrode structure 130 may have a structure in which it is extended to the inner portion of the epitaxial growth layer 120 so that it may contact the 2-dimensional electron gas (2DEG). For example, the drain electrode 136 may have an extension part 137 extended to the inner portion of the epitaxial growth layer 120 to contact the 2-dimensional electron gas (2DEG). For this, the epitaxial growth layer 120 may have a depression part 126 in which the extension part 137 is positioned. The depression part 126 may be a groove exposing the lower nitride layer 122. The drain electrode 136 having a structure as described above directly contacts the 2-dimensional electron gas (2DEG) defining a current movement path of the nitride based semiconductor device 100, such that it may have a turn-on resistance value close to 0. Accordingly, the drain electrode 136 has electrode characteristics similar to those of the ohmic contact in spite of being the Schottky electrode, such that the nitride based semiconductor device 100 may perform a switching operation at a significantly lower voltage, as compared to a drain electrode that does not contact the 2-dimensional electron gas (2DEG). Furthermore, the drain electrode 136 may prevent leakage current therethrough during a reverse direction operation of the nitride based semiconductor device 100.

As described above, the nitride based semiconductor device 100 according to an exemplary embodiment may be configured to include the base substrate 110, the epitaxial growth layer 120 generating the 2-dimensional electron gas (2DEG), and the electrode structure 130 disposed on the epitaxial growth layer 120, wherein the electrode structure 130 may include the gate electrode 132, the source electrode 134 disposed at one side of the gate electrode 132, and the drain electrode 136 disposed at the other side of the gate electrode 132 and having the extension part 137 extended to the inner portion of the epitaxial growth layer 120 to directly contact the 2-dimensional electron gas (2DEG). In this configuration, the drain electrode 136 may be the Schottky electrode forming the Schottky contact with the epitaxial growth layer 120. In this case, the drain electrode 136 contacts the 2-dimensional electron gas (2DEG) to have a minimal turn-on resistance, thereby making it possible to operate similar to the ohmic contact. Accordingly, the nitride based semiconductor device according to an exemplary embodiment of the present invention may operate even at a low turn-on voltage during a forward direction operation thereof to improve switching operation efficiency and increase withstand voltage.

In addition, with the nitride based semiconductor device according to an exemplary embodiment of the present invention, the Schottky electrode is used as the drain electrode, the drain electrode partially contacts the 2-dimensional electron gas to operate like the ohmic electrode, and the Schottky electrode has a structure in which it is extended to the inner portion of the epitaxial growth layer, thereby making it possible to prevent current density from being decreased.

Hereinafter, a method for manufacturing a nitride based semiconductor device according to an exemplary embodiment of the present invention will be described in detail. Herein, a description of contents overlapping with the nitride based semiconductor device 100 described with reference to FIGS. 1 and 2 may be omitted or simplified.

Figure 3:
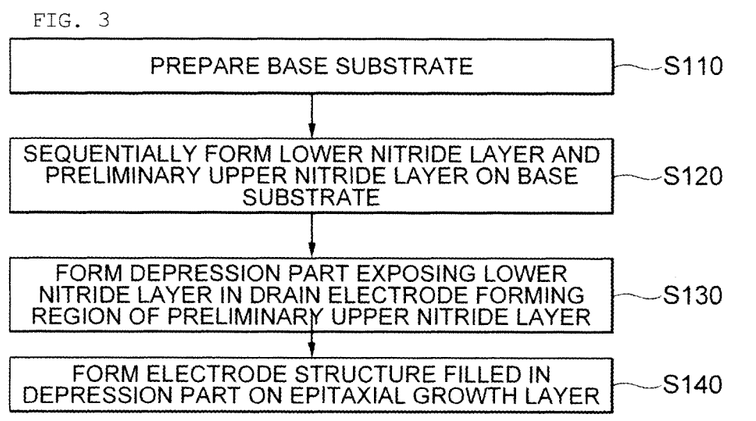
FIG. 3 is a flow chart showing a method for manufacturing a nitride based semiconductor device according to an exemplary embodiment of the present invention.
Figure 4A:
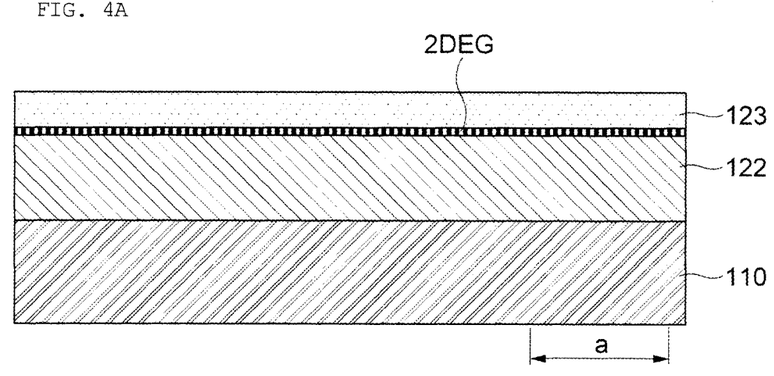
FIGS. 4A to 4C are views for explaining a process for manufacturing a nitride based semiconductor device according to an exemplary embodiment of the present invention.
Figure 4B:
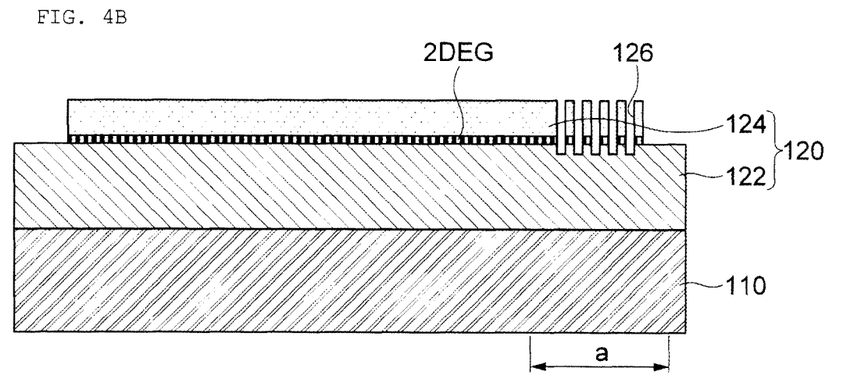
Figure 4C:
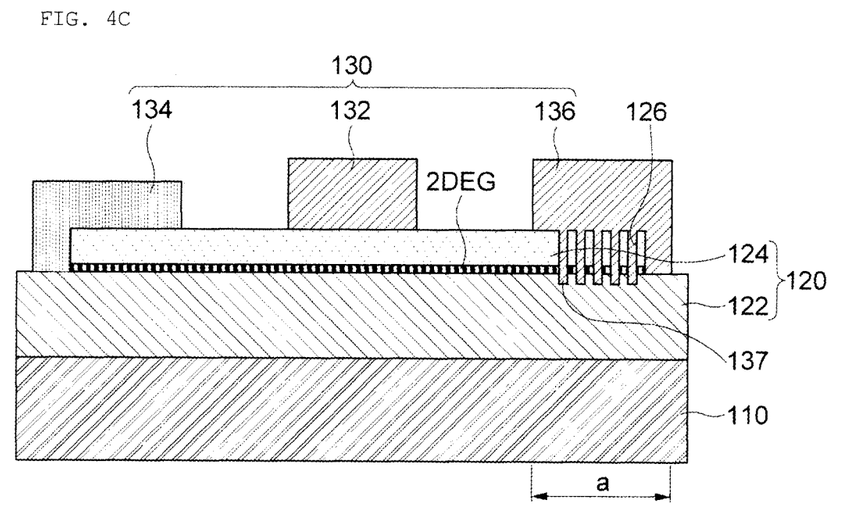

FIG. 3 is a flow chart showing a method for manufacturing a nitride based semiconductor device according to an exemplary embodiment of the present invention FIGS. 4A to 4C are views for explaining a process for manufacturing a nitride based semiconductor device according to an exemplary embodiment of the present invention.

Referring to FIGS. 3 and 3A, the base substrate 110 may be prepared (S110). For example, the preparing of the base substrate 110 may include preparing any one of the silicon substrate, the silicon carbide substrate, and the sapphire substrate.

The lower nitride layer 122 and a preliminary upper nitride layer 123 are sequentially formed on the base substrate 110 (S120). For example, the lower nitride layer 122 may be formed by performing an epitaxial growth process using the base substrate 110 as a seed layer, and the preliminary upper nitride layer 123 may be formed by performing an epitaxial growth process using the lower nitride layer 122 as a seed layer.

The epitaxial growth process may be a process growing a semiconductor layer including the III-nitride based materials. As an example, the epitaxial growth process forming the lower nitride layer 122 may be a process forming a gallium nitride (GaN) layer, and the epitaxial growth process forming the preliminary upper nitride layer 123 may be a process forming an aluminum gallium nitride (AlGaN) layer. In the inner portion of the epitaxial growth layer 120 formed as described above, the second-dimensional electron gas (2DEG) may be generated at the interface between the lower nitride layer 122 and the preliminary upper nitride layer 123.

Meanwhile, as an epitaxial growth process for forming the epitaxial growth layer 120, at least any one of a molecular beam epitaxial growth process, an atomic layer epitaxial growth process, a flow modulation organometallic vapor phase epitaxial growth process, a flow modulation organometallic vapor phase epitaxial growth process, and a hybrid vapor phase epitaxial growth process may be used.

Referring to FIGS. 3 and 4B, the depression part 126 exposing the lower nitride layer 122 may be formed at a drain electrode forming region a of the preliminary upper nitride layer 123 (S130). The forming of the depression part 126 may be made during the performing of a device separation process for electrical separation between the nitride based semiconductor devices. More specifically, the nitride based semiconductor devices are manufactured in a substrate level state and are then separated to unit devices by using a mesa process, which is a process electrically separating the devices on the substrate. The mesa process may be performed by forming a predetermined trench at the interface between the nitride based semiconductor devices. A depth of the trench may be adjusted so that the lower nitride layer 124 of the epitaxial growth layer 120 is exposed. Accordingly, since the depression part 126 is formed using the mesa process used for electrically separating the nitride based semiconductor devices, the method for manufacturing a nitride based semiconductor device according to an exemplary embodiment of the present invention may form the depression part 126 through the mesa process, without additionally performing a separate depression part formation process.

Referring to FIGS. 3 and 4C, the electrode structure 130 filled in the depression part 126 may be formed on the epitaxial growth layer 120 (S140). For example, the forming of the electrode structure 130 may include forming a metal layer covering the epitaxial growth layer 120, while being filled in the depression part 126, and patterning the metal layer by a photolithography process. Accordingly, the gate electrode 132, the source electrode 134 disposed at one side of the gate electrode 132, and the drain electrode 136 disposed at the other side of the gate electrode 132 may be formed on the epitaxial growth layer 120. Herein, the metal layer may be filled in an inner portion of the depression part 126 to contact the 2-dimensional electron gas (2DEG). Therefore, the drain electrode 136 may have the extension part 137 contacting the 2-dimensional electron gas (2DEG) through the depression part 126.

Here, since the metal layer is effectively filled in first and second depression parts 126, the forming of the metal layer may be preferably performed by a process having excellent step coverage. For example, the forming of the metal layer may be performed by any one of a chemical vapor deposition (CVD) process, an atomic layer deposition (ALD) process, an ion sputtering process, and a thermal oxide process. However, alternatively, as a process for forming the metal layer, a physical vapor deposition (PVD) process may also be used.

As described above, in the method for manufacturing a nitride based semiconductor device according to an exemplary embodiment of the present invention, the epitaxial growth layer 120 having the depression part 126 exposing the 2-dimensional electron gas (2DEG) may be formed on the base substrate 110, and the drain electrode 136 filled in the depression part 126 to contact the 2-dimensional electron gas (2DEG) may be formed at the drain electrode forming region a of the epitaxial growth layer 120. The drain electrode 136 contacts the 2-dimensional electron gas (2DEG), thereby making it possible to have characteristics like the ohmic electrode in spite of being the Schottky electrode. Therefore, with the method for manufacturing a nitride based semiconductor device according to an exemplary embodiment of the present invention, the electrode structure having the drain electrode contacting the 2-dimensional electron gas (2DEG) to decrease the resistance value may be formed to increase the withstand voltage and decrease the turn-on resistance value, thereby making it possible to manufacture the nitride based semiconductor device capable of improving the switching operation efficiency.

In addition, with the method for manufacturing a nitride based semiconductor device according to an exemplary embodiment of the present invention, the Schottky electrode is used as the drain electrode, the drain electrode partially contacts the 2-dimensional electron gas to operate like the ohmic electrode, and the Schottky electrode has a structure in which it is extended to the inner portion of the epitaxial growth layer, thereby making it possible to manufacture the nitride based semiconductor device capable of preventing current density from being lowered.

Hereinafter, modified examples of a method for manufacturing a nitride based semiconductor device according to an exemplary embodiment of the present invention will be described in detail. Herein, a description of contents overlapping with the nitride based semiconductor device 100 described with reference to FIGS. 1 and 2 may be omitted or simplified.

Figure 5:
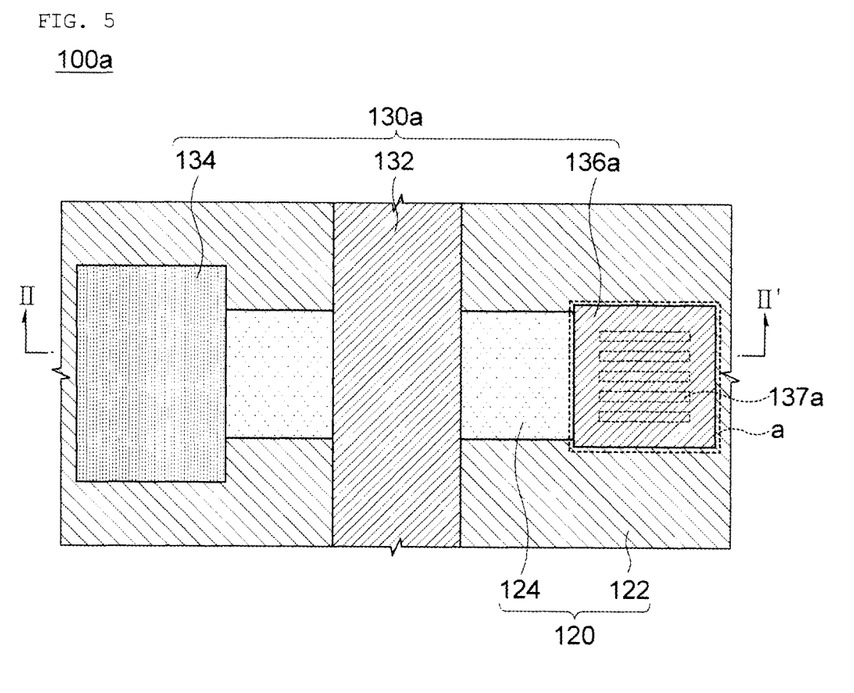
FIG. 5 is a view showing a modified example of a nitride based semiconductor device according to an exemplary embodiment of the present invention.
Figure 6:
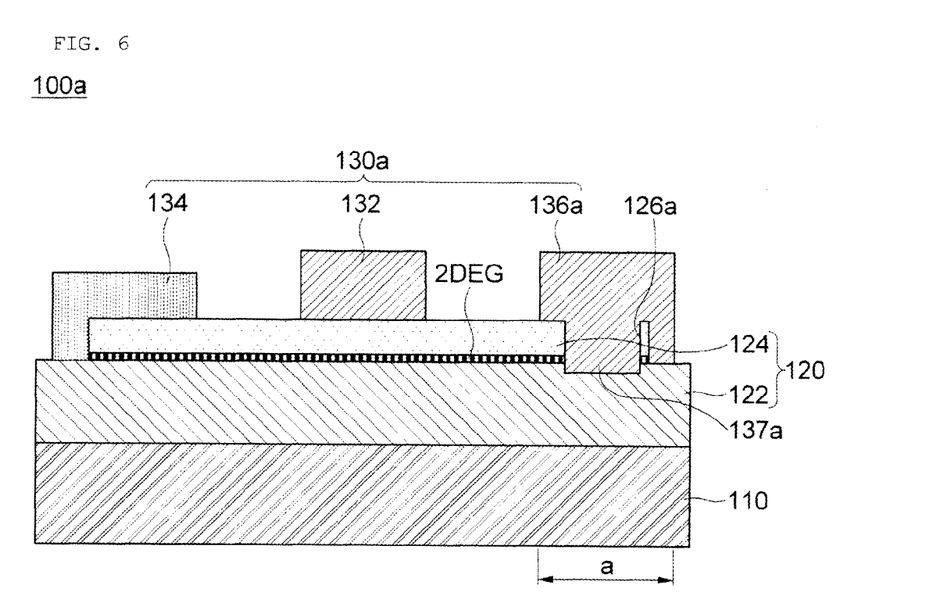
FIG. 6 is a cross-sectional view taken along line II-II' of FIG. 5.

FIG. 5 is a view showing a modified example of a nitride based semiconductor device according to an exemplary embodiment of the present invention, and FIG. 6 is a cross-sectional view taken along line II-II' of FIG. 5.

Referring to FIGS. 5 and 6, a nitride based semiconductor device 100a according to an modified example of the present invention may include a drain electrode 136a having an extension part 137a with a line-shaped cross section, as compared to the nitride based semiconductor device 100 described with reference to FIG. 1.

More specifically, the nitride based semiconductor device 100a may be configured to include the base substrate 110, the epitaxial growth layer 120, and an electrode structure 130a formed on the epitaxial growth layer 120, wherein the electrode structure 130a may include the gate electrode 132, the source electrode 134 disposed at one side of the gate electrode 132, and the drain electrode 136a disposed at the other side of the gate electrode 132. The drain electrode 136a may be the Schottky electrode forming the Schottky contact with the epitaxial growth layer 120. In addition, the drain electrode 136a has the extension part 137a extended to the inner portion of the epitaxial growth layer 120 so as to contact the 2-dimensional electron gas (now shown) in the inner portion of the epitaxial growth layer 120, wherein the extension part 137a may have the line-shape cross section. The extension part 137a is provided in plural. In this configuration, the extension parts 137a may be disposed to form lines parallel with each other. A depression part 126a having a shape corresponding to that of the extension part 137a may be formed in the epitaxial growth layer 120 so that the extension part 137a is inserted into the inner portion of the epitaxial growth layer 120.

Figure 7:
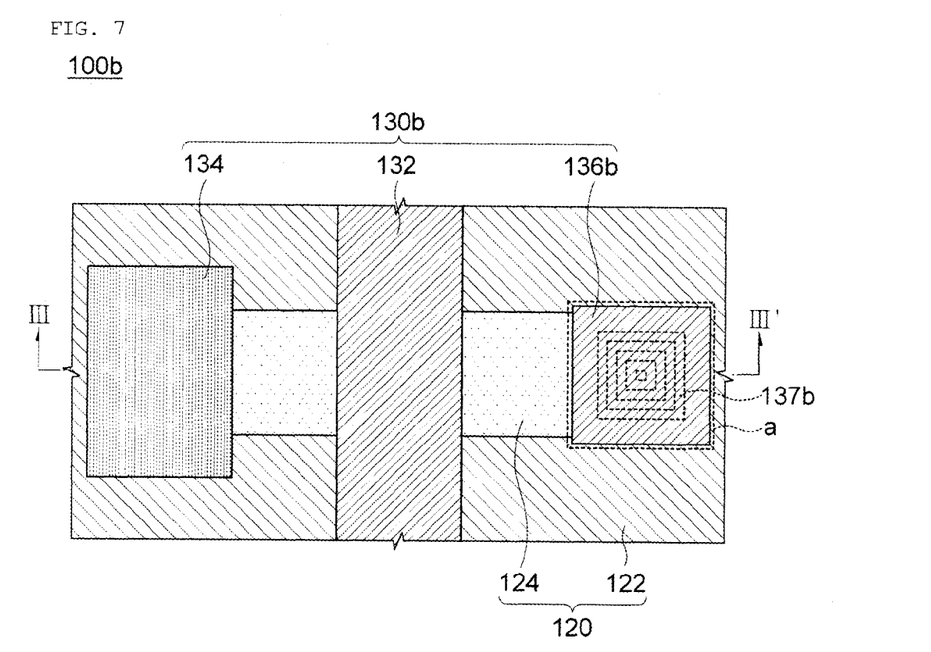
FIG. 7 is a view showing another modified example of a nitride based semiconductor device according to an exemplary embodiment of the present invention.
Figure 8:
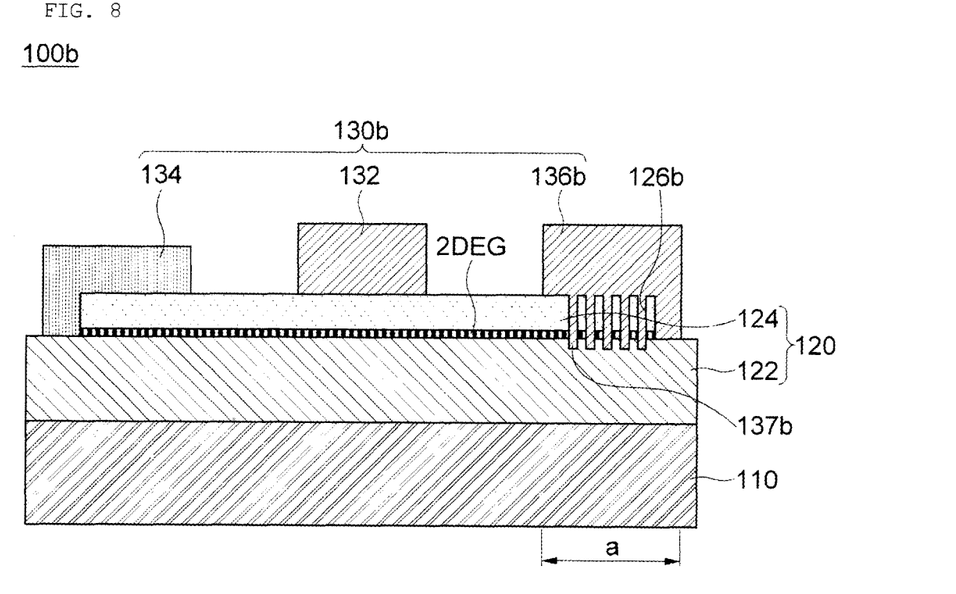
FIG. 8 is a cross-sectional view taken along line of FIG. 7.

FIG. 7 is a view showing another modified example of a nitride based semiconductor device according to an exemplary embodiment of the present invention, and FIG. 8 is a cross-sectional view taken along line III-III' of FIG. 7.

Referring to FIGS. 7 and 8, a nitride based semiconductor device 100b according to another modified example of the present invention may include a drain electrode 136b with a rectangular ring-shaped cross section, as compared to the nitride based semiconductor device 100 described with reference to FIG. 1.

More specifically, the nitride based semiconductor device 100b may include an electrode structure 130b formed on the epitaxial growth layer 120, wherein the electrode structure 130b may include the gate electrode 132, the source electrode 134 disposed at one side of the gate electrode 132, and the drain electrode 136b disposed at the other side of the gate electrode 132. The drain electrode 136b may be the Schottky electrode forming the Schottky contact with the epitaxial growth layer 120. In addition, the drain electrode 136b has the extension part 137b extended to the inner portion of the epitaxial growth layer 120 so as to contact the 2-dimensional electron gas (now shown) in the inner portion of the epitaxial growth layer 120, wherein the extension part 137b may have the ring-shape cross section. The extension part 137b may have a rectangular ring shape. The extension part 137b may have a circular ring shape. The extension part 137b is provided in plural. In this configuration, the extension part 137b may be disposed to have a plurality of concentric rings. A depression part 126b having a shape corresponding to that of the extension part 137b may be formed in the epitaxial growth layer 120 so that the extension part 137b is inserted into the inner portion of the epitaxial growth layer 120.

The nitride based semiconductor device according to the exemplary embodiment of the present invention includes the epitaxial growth layer generating the 2-dimensional electron gas in the inner portion thereof and the transistor electrode structure formed on the epitaxial growth layer, wherein the drain electrode of the transistor electrode structure includes the extension part extended to the inner portion of the epitaxial growth layer to contact the 2-dimensional electron gas to reduce a current resistance value through the 2-dimensional electron gas, such that the withstand voltage in increased and the turn-on resistance is decreased, thereby making it possible to improve efficiency of the switching operation.

With the nitride based semiconductor device according to the exemplary embodiment of the present invention, the Schottky electrode is used as the drain electrode, the drain electrode partially contacts the 2-dimensional electron gas to operate like the ohmic electrode, and the Schottky electrode has a structure in which it is extended to the inner portion of the epitaxial growth layer, thereby making it possible to prevent current density from being lowered.

With the method for manufacturing a nitride based semiconductor device according to the exemplary embodiment of the present invention, the epitaxial growth layer is formed on the base substrate, and the transistor electrode structure having the drain electrode contacting the 2-dimensional electron gas (2DEG) of the epitaxial growth layer to decrease the turn-on resistance value is formed on the epitaxial growth layer to increase the withstand voltage and decrease the turn-on resistance value, thereby making it possible to manufacture the nitride based semiconductor device capable of improving the switching operation efficiency.

With the method for manufacturing a nitride based semiconductor device according to the exemplary embodiment of the present invention, the Schottky electrode is used as the drain electrode, the drain electrode partially contacts the 2-dimensional electron gas to operate like the ohmic electrode, and the Schottky electrode has a structure in which it is extended to the inner portion of the epitaxial growth layer, thereby making it possible to manufacture the nitride based semiconductor device capable of preventing current density from being lowered.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A nitride based semiconductor device comprising:
   a base substrate;
   an epitaxial growth layer disposed on the base substrate and generating a 2-dimensional electron gas in an inner portion thereof; and
   an electrode structure disposed on the epitaxial growth layer,
   wherein the electrode structure includes:
      a gate electrode;
      a source electrode disposed at one side of the gate electrode; and
      a drain electrode disposed at the other side of the gate electrode and having an extension part extended to the inner portion of the epitaxial growth layer to contact the 2-dimensional electron gas, wherein:
   the drain electrode is a first Schottky electrode forming a first Schottky contact with the epitaxial growth layer,
   the gate electrode includes a second Schottky electrode forming a second Schottky contact with the epitaxial growth layer,
   the source electrode includes an ohmic electrode forming an ohmic contact with the epitaxial growth layer,
   the epitaxial growth layer includes:
      a lower nitride layer grown using the base substrate as a seed layer; and
      an upper nitride layer grown using the lower nitride layer as a seed layer and having a wider energy band gap than that of the lower nitride layer, and
   the extension part extends to an upper part of the lower nitride layer so that the extension part is not contacted to the base substrate.

2. The nitride based semiconductor device according to claim 1, wherein the extension part has an island shaped cross section.

3. The nitride based semiconductor device according to claim 1, wherein the extension part is formed to have a lattice pattern.

4. The nitride based semiconductor device according to claim 1, wherein the extension part has a ring shaped cross section.

5. The nitride based semiconductor device according to claim 1, wherein the base substrate includes at least any one of a silicon substrate, a silicon carbide substrate, and a sapphire substrate.

* * * * *